United States Patent [19]

Almasi et al.

[11] 4,164,026
[45] Aug. 7, 1979

[54] CONTIGUOUS ELEMENT FIELD ACCESS BUBBLE LATTICE FILE

[75] Inventors: George S. Almasi, Katonah; Yeong S. Lin, Mount Kisco, both of N.Y.

[73] Assignee: International Business Machines Corporation, Armonk, N.Y.

[21] Appl. No.: 866,195

[22] Filed: Dec. 30, 1977

[51] Int. Cl.² .............................................. G11C 19/08
[52] U.S. Cl. ......................................... 365/3; 365/15; 365/36; 365/37
[58] Field of Search ..................... 365/3, 15, 30, 36, 41

[56] References Cited

U.S. PATENT DOCUMENTS

| | | | |
|---|---|---|---|
| 4,023,150 | 5/1977 | Voegeli | 365/3 |
| 4,125,876 | 11/1978 | Dimyan | 365/3 |
| 4,128,895 | 12/1978 | Almasi et al. | 365/36 |

*Primary Examiner*—James W. Moffitt
*Attorney, Agent, or Firm*—Jackson E. Stanland

[57] ABSTRACT

A bubble domain storage system is described which has the best features of contiguous element bubble propagation systems and bubble lattice file systems. An array of magnetic bubble domains, such as a lattice, is moved along contiguous propagation patterns in response to the reorientation of a magnetic field in the plane of the bubble domain film. Adjacent rows of bubble domains in the array move in opposite directions to provide individual storage loops within the array. Information accessing can be achieved by the use of input/output registers similar to those used in other contiguous disk bubble domain storage systems. For example, the storage system can be a conventional major/minor loop organization using contiguous element propagation patterns for the storage registers and for the input/output registers. Every bit position in the storage registers is populated by a bubble domain where the average distance between adjacent bubble domains is less than that in a system where bubbles are isolated from one another. For example, the storage registers can be arranged so that the separation between adjacent bubble domains in the storage registers is 2-3 bubble diameters. The bubbles are coded in terms of the magnetic properties of individual bubble domains, or a double layer structure can be used in which an array of bubble domains is in one layer and information bubble domains are in the other layer, coded in accordance with presence/absence. Viewed another way, the invention is a bubble storage system using contiguous propagation elements which is fully populated by interacting bubble domains.

28 Claims, 11 Drawing Figures

CONTIGUOUS ELEMENT FIELD ACCESS BUBBLE LATTICE FILE

BACKGROUND OF THE INVENTION

1. Field of the Invention

This invention relates to field accessing of magnetic bubble domain arrays using contiguous element propagation patterns, and more particularly to a magnetic bubble domain storage system in which all bit positions of a contiguous element propagation pattern are occupied by bubble domains sufficiently close to one another that interactions occur therebetween.

2. Description of the Prior Art

Magnetic bubble domain technology has advanced considerably in the past five years. In particular, attempts are now being made to provide very high density storage systems using magnetic bubble domains for representing information. Two such techniques for achieving high density storage systems are the magnetic bubble lattice file, and the contiguous propagation pattern storage system. In the lattice file, bubble domains are packed very close to one another so that interactions exist between adjacent bubble domains. Since the bubble domains are packed so closely, lattice storage files have a higher storage density than conventional bubble domain storage systems where the bubbles are spaced sufficiently far apart that adjacent domains do not appreciably interact with one another. The basic concepts of a magnetic bubble lattice file are described in U.S. Pat. No. 4,052,710 assigned to the present assignee.

In the lattice file, information is coded in terms of the properties of the magnetic bubble domain system itself, since each bit position is occupied by a bubble domain. This type of coding is described in U.S. Pat. No. 3,890,605, also assigned to the present assignee. A technique for accessing information from selected columns of the bubble lattice file is described in U.S. Pat. No. 4,040,038, also assigned to the present assignee.

Bubble storage systems using contiguous element propagation patterns, commonly called "contiguous disk" patterns, do not pack bubble domains so closely to one another that appreciable interactions occur therebetween. Rather, the conventional bubble-bubble spacing of approximately four bubble diameters is followed to minimize interactions. However, contiguous disk bubble domain systems have an advantage over other types of bubble domain systems using isolated bubble domains in that the lithography requirements of the propagation elements are relaxed when contiguous elements are used. That is, the size of the individual propagation element in a contiguous disk pattern is large compared to the size of the bubble domain. This means that, for a given bubble domain size, the lithography required to make a contiguous disk propagation pattern is less stringent than that required to make discrete element propagation patterns, such as the familiar T and I-bar patterns or C-bar (half-disk) patterns. One of the reasons for this is that there is no gap across which bubble domains must propagate in a contiguous disk pattern, in contrast with the other patterns mentioned where bubble domains must cross a gap between adjacent propagation elements.

The conventional technique for moving magnetic bubble domains in a bubble lattice file uses current-carrying conductors to provide magnetic fields which move the bubble domains. However, the designs for doing this are complex and not all bubble domains in the lattice are directly driven (that is, bubble-bubble interaction is used to drive some of the bubble domains). Further, in-plane magnetic fields are often required for stabilization of wall states in the bubble domains in the lattice. The presence of the in-plane stabilization field seems to affect the propagation margins in the lattice, when it is moved by current-carrying conductor patterns. For this reason, field accessing of the lattice has been developed recently in order to improve propagation margins. Such techniques are represented by U.S. Pat. No. 4,023,150; U.S. Pat. No. 4,028,685; U.S. Pat. No. 4,034,357; and copending application to H. Chang, Ser. No. 645,594, filed Dec. 31, 1975 and now U.S. Pat. No. 4,067,002. In all of these references, arrays of magnetically soft propagation elements are used to move lattices of magnetic bubble domains in response to the reorientation of a magnetic field in the plane of the array.

Even though lattice translation by field accessing appears to offer better propagation margins, fabrication of arrays is still limited by lithography requirements. For example, the arrays typically comprise discrete propagation elements. In order to have the propagation elements directly act on all, or most, of the bubbles in the lattice, dense arrays have to be formed. However, this means that the propagation elements have to be close to one another and this requires advanced lithography. On the other hand, less dense arrays of propagation elements require less stringent lithography but also have smaller propagation margins, since increasing numbers of bubbles in the lattice are moved by the bubble-bubble interaction rather than by direct forces due to magnetic poles produced by the propagation elements.

In a conventional magnetic bubble domain lattice using current accessing techniques, translation of the lattice depends upon buffer regions produced at opposing ends of the lattice. These buffers usually contain stripe domains which shrink or elongate to cushion the lattice motion and maintain the integrity of the lattice. However, individual bubble domains are cut-off from the tips of the stripes to fill the voids in the lattice as the lattice is moved away from the elongating stripes. This cutting operation requires a high current density which may limit the bit density ultimately achievable with conventional bubble lattice files. Although this limitation is eliminated using the aforementioned field access techniques for translating a lattice, such field access lattices have more stringent resolution requirements than the conductor accessed lattices. For example, a permalloy propagation element in a field access system may have a width of approximately one-half bubble diameter.

Accordingly, it is a primary object of the present invention to provide a field accessed bubble lattice having reduced lithography requirements.

It is another object of the present invention to provide a contiguous element bubble propagation device having higher storage density than prior contiguous element propagation devices.

It is another object of the present invention to provide bubble lattice systems which exhibit the best features of both conventional contiguous element bubble systems and bubble lattice files.

It is another object of the present invention to provide a fully populated bubble device using contiguous element propagation patterns.

It is another object of the present invention to provide a bubble lattice system which requires less structure than conventional lattice systems and which has improved propagation margins.

It is yet another object of the present invention to provide ultra-high density contiguous element propagation storage devices.

It is another object of the present invention to provide a complete magnetic bubble domain storage system using contiguous element propagation patterns, where all bit positions in the storage system are occupied by interacting bubble domains.

It is a still further object of the present invention to provide improved field access bubble lattice systems.

It is another object of the present invention to provide a technique for moving bubble domains in an interacting array of domains using naturally occurring domain walls for high resolution propagation, rather than high resolution overlay or underlay structures.

BRIEF SUMMARY OF THE INVENTION

A magnetic bubble domain storage system is described in which contiguous element propagation patterns are used to move bubble domains in an array of interacting domains to provide an improved storage system. The advantages of such a system relate to the high density achievable with the bubble lattice concept and the relaxed lithography requirements of bubble propagation patterns using contiguous propagation elements.

Accordingly, the invention is comprised of contiguous element bubble propagation patterns wherein each bit position in the pattern is occupied by a bubble domain. If it is desired to have the bubble domains represent information, they can be coded in accordance with their wall properties, or some other form of coding can be used. In a preferred embodiment, the bubble domains occupying storage positions along the contiguous propagation elements are located sufficiently close to one another that interactions occur therebetween. Still further, the bubble domains can be part of a lattice of magnetic bubble domains. Application of a reorienting magnetic field in the plane of the contiguous propagation elements causes movement of domains in the lattice.

Writing of new information into storage is achieved using conventional bubble domain generators, such as current-assisted nucleators. Information is transferred from an input register to the lattice storage, using known transfer switches. Additionally, information can be removed from the lattice storage by a similar transfer switch which moves bubble domains from the lattice to an output register. Thus, the complex structures normally associated with bubble lattices for accessing of bubble columns therein are not required in the present invention, although such column accessing structures can be combined with the present invention if desired.

The bubble domains can be coded in any of a number of well known ways. For example, one form of coding uses the wall magnetization state of the bubble domain to represent information. Depending upon the wall magnetization state, the domains will propagate in a particular direction when subjected to a gradient magnetic field. Also, bubble domains in the lattice can be used to move bubble domains coded in terms of presence/absence in an adjacent magnetic layer, in accordance with the concepts taught in the aforementioned copending application to Chang, Ser. No. 645,594, now U.S. Pat. No. 4,067,002.

The contiguous propagation elements can be fabricated in accordance with known principles. As an example, ion implantation can be used to make contiguous propagation patterns in a magnetic bubble domain garnet film, or in a separate garnet film used as a drive layer for movement of bubble domains in an underlying bubble film. Examples of such contiguous element patterns are found in U.S. Pat. No. 3,967,002 and copending application Ser. No. 645,737, filed Dec. 31, 1975 now U.S. Pat. No. 4,070,658, both of which are assigned to the present assignee.

The contiguous propagation elements can also be patterned from magnetically soft overlayers. For example, a magnetic film having in-plane magnetization can have contiguous apertures therein. In this situation, bubble domains will propagate along a path defined by the edges of the apertures, as the magnetic field reorients in the plane of the magnetically soft layer. This concept is shown in U.S. Pat. No. 3,988,722, also assigned to the present assignee.

Coded lattice bubble domains are read in accordance with known principles for detecting wall magnetization states. Examples of this are described in aforementioned U.S. Pat. No. 3,890,605, and in other references. If a double layer coding scheme is used, coding can be in terms of presence/absence and sensing can be achieved by well known techniques.

Bubble domains in the storage registers can be closer to one another than domains in conventional contiguous disk propagation registers. For example, bubble-bubble spacings of 2–3 bubble diameters are suitable, although it appears possible to pack the bubbles more closely than this. Since there is interaction between adjacent bubble domains, a boundary confinement structure may be needed to prevent domains from moving away from the individual storage registers. Contiguous propagation patterns, current-carrying conductors, etc. are suitable for this purpose. Further, since adjacent bubble domains interact with one another, the magnitude of the stabilizing bias field directed normal to the bubble domain film is less than it is in the case of isolated bubble domains. A representative bias field magnitude is approximately $(0.2-0.3)\, 4\pi M_s$, where $M_s$ is the saturation magnetization of the bubble domain film.

These and other objects, features, and advantages will be more apparent from the following more particular description of the preferred embodiments.

DETAILED DESCRIPTION OF THE PREFERRED EMBODIMENTS

FIG. 1

Figure 1:
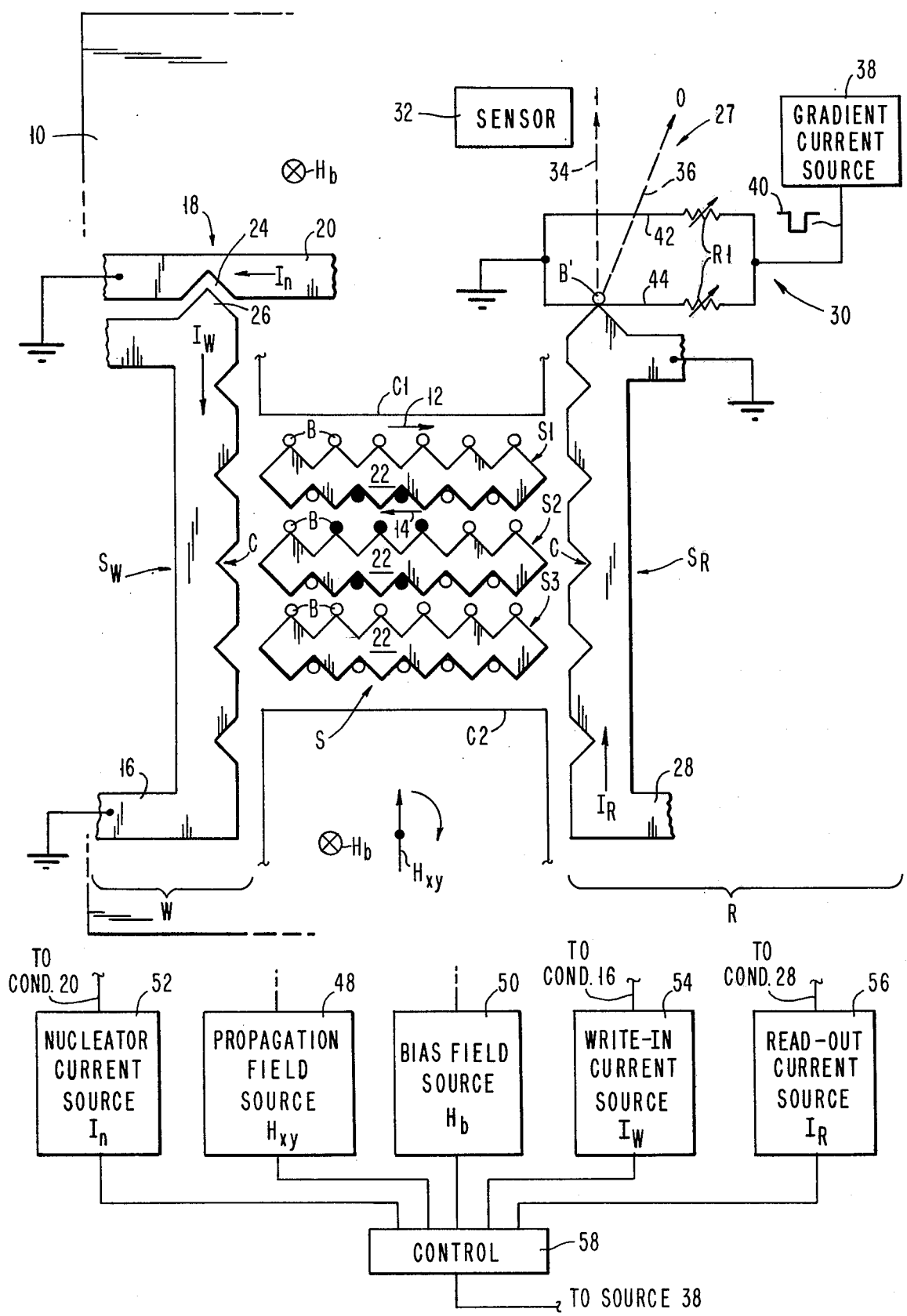
FIG. 1 illustrates a magnetic bubble domain storage system using contiguous element propagation patterns, having interacting magnetic bubble domains in the storage area.

FIG. 1 illustrates a magnetic bubble domain storage system where contiguous propagation elements are used to move arrays of magnetic bubble domains. The bubble domains are closely packed to one another so that interactions occur between adjacent domains. In one embodiment, the domains will at times form a magnetic bubble domain lattice having hexagonal close packing where columns of domains are at an angle of 60° with horizontal rows of domains.

In more detail, the storage organization of FIG. 1 is organized in a major/minor loop organization, for purposes of illustration of the present invention. It should be realized that any type of organization can be used, one of the principles of the present invention being the use of contiguous element propagation patterns to move closely packed bubble domains by naturally occurring high resolution magnetic charged walls. In this FIG., a substrate 10 comprising the magnetic medium in which bubbles can be moved is divided into a storage area generally designated S, a write-in area generally designated W, and a read-out area generally designated R. Storage area S is comprised of a plurality of bubble domain storage registers S1, S2, and S3. These storage registers are the familiar minor loops of a major/minor loop bubble organization. Bubble domains B propagate around each of the storage loops as a magnetic field $H_{xy}$ reorients in the plane of substrate 10. Thus, bubble domains B on the top of register S1 propagate to the right in the direction of arrow 12, while bubble domains on the bottom of register S1 propagate to the left in the direction of arrow 14 as field $H_{xy}$ rotates in the manner indicated. This same type of motion occurs in response to the reorientation of field $H_{xy}$ in registers S2 and S3, also. Of course, while only three storage registers are shown for purposes of illustration, it should be appreciated that any number of registers can be provided, and the registers can have any lengths.

Bubble domains B in the storage area S occupy all available bit positions of the register. While this could also be the case for a conventional major/minor loop organization with all information states the same, the difference in the present situation is that the bubble domains B are located sufficiently close to one another that interactions occur between adjacent bubbles. For example, bubble domains B are separated from one another by spacings less than 4 bubble diameters. A representative range of spacings is about 1.5-3 bubble diameters. Still further, the bubble domains B in the storage area S can assume the geometry of a lattice of bubble domains having hexagonal close packed spacing during some phase of their motion. This is illustrated by the darkened circles representing bubble domains in the center of the storage area which is in the shape of a hexagon. Each column of domains is at an angle of approximately 60° with each row of bubble domains in this lattice. Thus, if information is represented by individual domains, a storage area of very high density is provided.

Storage registers S1-S3 are comprised of contiguous propagation elements along which the bubble domains B propagate as field $H_{xy}$ reorients. It is well known in the art to provide contiguous propagation patterns using techniques such as ion implantation or patterning of continuous magnetic layers. For example, reference is made to aforementioned U.S. Pat. No. 3,967,002 describing ion implanted contiguous propagation elements, and U.S. Pat. No. 3,988,722 which describes contiguous propagation patterns formed in a magnetic layer by apertures therein. In the practice of the present invention, the particular way in which the contiguous propagation elements are formed is immaterial.

Input region W is used to write information into the storage area S. In contrast with the usual more complex structures used to bring information into a bubble lattice, the structure of FIG. 1 can be the type of shift register used in a conventional major/minor loop memory organization. For this reason, write-in region W is comprised of a write-in shift register $S_W$. Register $S_W$ is also illustratively comprised of contiguous propagation elements. Input region W also includes a current-carrying conductor 16 and a bubble nucleator, generally designated 18. Conductor 16 is used to transfer bubble domains from register $S_W$ into the storage area, while nucleator 18 is used to produce magnetic bubble domains which are transferred to register $S_W$. The regions around conductor 16 and conductor 20 of nucleator 18 are ion implanted. Correspondingly, the region around the metallic diamond layer 22 (in storage area S) is also ion implanted.

Conductor 20 is used to nucleate bubble domains in cusp 24. Conductors 20 and 16 are used to define the ion implantation patterns for the nucleator 18 and for the input register $S_W$. They are also used to transfer bubble domains from nucleator 18 to the tip 26 of register $S_W$ and for transfer of domains from this input register to the individual storage registers S1-S3. This transfer operation will be explained later.

The read-out section R of the storage organization is comprised of a read-out shift register $S_R$ and a bubble domain detection means, generally designated 27. Register $S_R$ is also comprised of ion implanted propagation elements. Conductor 28 overlies register $S_R$ and is used to define the ion implantation pattern used for this output register. Conductor 28 also functions to transfer information from storage area S to output register $S_R$. This transfer operation will also be explained in more detail later.

Bubble detection means 27 is comprised of a magnetic field gradient producing means 30 and a bubble domain sensing element 32. This type of detection means 27 is particularly suited for the discrimination and detection of bubble domains which are coded in terms of the number of revolutions of wall magnetization in the domains. In accordance with the principles described earlier, bubble domains having different winding numbers (corresponding to different revolutions of their wall magnetization) are deflected in different angles by a gradient magnetic field. In the example chosen, bubble domains with winding number one will not deflect in the presence of a gradient field and will proceed in a straight line along the direction indicated by dashed arrow 34. For illustrative purposes, this is indicated as a "1 bit". On the other hand, a bubble domain which deflects in the direction of dashed arrow 36 is denoted a "0-bit".

The gradient field producing means 30 is comprised of a gradient current source 38 which produces a pulse 40 of current in conductors 42 and 44. Adjustable resistors R1 in each of the conductors 42 and 44 are used to adjust the current levels in each conductor. As is known, the presence of current in a parallel arrangement of conductors such as this will produce a vertical magnetic field in the area between the conductors and any in-plane components of field will be cancelled. A bubble domain B' located at the tip of register $S_R$ will be moved toward the sensor by the gradient field between conductors 42 and 44. Depending upon the winding number of the bubble, it will follow either arrow 34 or arrow 36. Of course, conductors 42 and 44 are electrically isolated from conductor 28.

Propagation field source 48 includes x and y current-carrying coils for producing the drive field $H_{xy}$. Bias field source 50 provides the stabilizing magnetic bias field $H_b$. Source 50 is comprised of well known magnetic field producing components and can be, for example, a permanent magnet, a magnetic exchange-coupled layer, or a current-carrying coil surrounding the wafer on which the storage device is formed.

A nucleator current source 52 is electrically connected to conductor 20, and provides current $I_n$ in conductor 20. A write-in current source 54 is electrically connected to conductor 16, and provides the write-in current $I_w$. This current is used to transfer bubble domains from input register $S_W$ to the storage registers S1–S3.

A read-out current source 56 provides the read-out current $I_R$ and is electrically connected to conductor 28. This current is used to transfer bubble domains from the storage registers S1–S3 to the output register $S_R$.

A control unit 58 provides the proper timing and synchronization pulses to the field sources 48 and 50, as well as to the current sources 38, 52, 54, and 56. Control units of this type are well known in the art, and are used to synchronize the various components in the overall storage organization.

Because bubble domains in storage area S interact with one another, there may be a tendency for domains in the top and bottom rows of the storage area to move away (i.e., be pushed away) from the registers along which they propagate. For this reason, current-carrying conductors C1 and C2 are provided. Current in these conductors produces a confining magnetic field which exerts forces tending to hold the outermost bubble domains in the storage area. For example, a current of the appropriate polarity in conductor C1 will produce a magnetic field tending to repel bubble domains B on the top of register S1. For ease of illustration, the source which provides current to conductors C1 and C2 is not shown. This type of confinement means, and many other types, are shown in aforementioned U.S. Pat. No. 4,052,710. A detailed analysis of adjacent bubble interaction effects can be estimated from a paper by Y. S. Lin and P. J. Grundy which appeared in J. Appl. Phys. 45, No. 9, Sept. 1974, at p. 4084.

Since magnetic bubble domains in the storage area S are located close to one another and have interactions therebetween, the magnitude of the bias field $H_b$ need not be as large as it usually is when the information domains are magnetically isolated from one another. For example, $H_b$ in the storage area S can be about $(0.2-0.3) 4\pi M_s$, where $M_s$ is the saturation magnetization of the bubble film. If bubble domains are spaced farther from one another in the registers $S_w$ and $S_R$, so that they are isolated from one another, the magnitude of the bias field $H_b$ in regions outside of the storage area will be somewhat larger than its magnitude within the storage area. In fact, the magnitude can be set to be that usually used in the case of a storage system having isolated magnetic domains. Aforementioned U.S. Pat. No. 4,052,710 describes many techniques for providing regions of different magnetic field bias and reference is made to that patent for structure to achieve this purpose. Still further, it may be that the bias field $H_b$ can be uniform throughout the entire magnetic bubble domain chip in many instances. For example, if the spacing between bubble domains in the storage area averages about 3 bubble diameters, the interaction between adjacent bubble domains may not be so strong that regions of differing magnetic bias field magnitude are required. Considerations regarding the amount of bias field needed depend upon the magnetic bubble material chosen and the packing density required in all portions of the storage chip. These factors are well known to those of skill in the art and they are easily provided by the techniques described in U.S. Pat. No. 4,052,710.

The operation of the storage system of FIG. 1 is similar to that of other major/minor loop organizations. For example, charged wall nucleator 18 produces a magnetic bubble domain at the cusp 24 when the field $H_{xy}$ has an appropriate phase, as described in copending application Ser. No. 801,963, filed May 31, 1977 now U.S. Pat. No. 4,128,825. Generation of the bubble domain is under the influence of nucleating current $I_n$. A technique for controllably generating bubble domains with "1" and "0" states is described in U.S. Pat. No. 3,996,577. That technique can be used to generate coded bubbles in the present storage system.

The nucleated domain moves to input register $S_W$ and then propagates along this register until it is opposite the register S1–S3 to which it is to be transferred. At this time, a current pulse $I_w$ in conductor 16 produces a magnetic field which will transfer the bubble domain to the storage area S. The transfer is in accordance with the transfer switches described in copending application Ser. No. 755,897, filed Dec. 30, 1976. Those switches operate by producing a magnetic charged wall which bridges each cusp C of the register $S_W$ and the aligned tip of the adjacent storage register S1–S3. That is, current $I_w$ causes the magnetic charged wall to substantially bridge the gap between the cusp C and the adjacent end of the opposing storage register. The bubble domain will then move along the magnetic charged wall to the storage register.

In order to transfer domains from the storage registers to the output register $S_R$ an operation analogous to the write-in operation occurs. That is, a magnetic charged wall can be made to bridge across the gap between the storage registers S1–S3 and the output register $S_R$. A bubble domain in the appropriate location on the end of the storage register (S2, for example) will then move along the magnetic charged wall to the cusp C of the register $S_R$. This domain will then propagate along register $S_R$ to the upper tip of register $S_R$ as field $H_{xy}$ reorients to occupy the position occupied by domain B' in FIG. 1. At that location, the domain will be moved toward the sensor when a current pulse 40 is applied in the conductors 42 and 44. Domain B' will follow either path 34 or path 36 and will be discriminated in this way. After discrimination, the domain can be annihilated by any of several well known techniques.

Thus, techniques used in conventional magnetic bubble domain systems are applied for input and output operations even though information is stored as a densely packed array. As will be explained more fully later, numerous advantages result.

FABRICATION

The structure of FIG. 1 is easily fabricated using conventional techniques. For example, when the bubble propagation elements are to be ion implanted elements, conductors 16 and 28 can be portions of an ion implantation mask. Metallic portions 22 are a part of the ion implantation mask used to define storage registers S1–S3. Nucleator conductor 20, confinement conductors C1 and C2, and the gradient producing conductors 42 and 44 can also be formed at the same time as metallic layers 16, 22, and 28.

Suitable overlay fabrication steps include the evaporation of a Ti-Au plating base layer over the entire magnetic wafer, followed by a first masking level, such as a patterned resist level. The gold layer to be used for the various conductors is then plated through the first mask to a thickness of about 4,000 Angstroms. This gold layer will be used for current-carrying functions and also to define the ion implantation mask used when the magnetic layer is ion implanted to form the contiguous propagation elements. After this, a second masking level can be applied in order to plate permalloy for the bubble domain sensing element (assuming a magnetoresistive type sensor is used). The permalloy layer is approximately 3,000 Angstroms thick, if a permalloy stretcher is used in combination with the sensing element. The bubble material, or a separate magnetic drive layer, is then ion implanted and the plating base is removed to yield the final device.

ADVANTAGES

As has been suggested, the structure and operation of the storage system of FIG. 1 offers many advantages when compared to conventional bubble storage systems. The main advantage is that the high density of the lattice is achieved in a system where the less desirable and more complex features of lattice storage systems are not required. For example, the input and output operations necessary for information accessing are done by techniques used in conventional isolated-bubble storage systems.

Additionally, the buffer type arrangements customarily used for movement of lattices, as described in U.S. Pat. No. 3,930,244, are not required. This reduces power consumption and avoids the need for extra current-carrying conductors.

Another important feature of the present invention is that the lattice is translated by field accessing but the patterns used for translation are coarse in terms of the bubble diameter and the bubble-bubble spacing. This is a key feature of the present invention since it eases lithography requirements in the storage device. Associated with this is the fact that bubble domains travel along the edges of registers in the storage area and therefore there is a direct driving force charged wall) on each of the bubble domains. Because less reliance is placed on bubble-bubble interaction for movement of the domains in the storage area, propagation margins are improved. Thus, the invention achieves direct drive of all bubbles in the array not by high resolution lithography (which is undesirable), but by naturally occuring high resolution magnetic charged walls which couple to each of the bubble domains. The net result is that direct drive of array bubbles is provided without having to pay the price of requiring high resolution magnetic structure.

A point of distinction between conventional lattice systems and the present system is that alternate rows of bubble domains in the present system propagate in opposite directions as the field $H_{xy}$ reorients. In the usual lattice system, all domains in the lattice move in the same direction during translation of the lattice. The fact that direct interaction between the magnetic propagation elements and the bubbles occurs for all bubble domains in the lattice makes this possible in the present invention. Since alternate rows of the stored bubbles move in different directions, bubbles in the storage area are not arranged in a regular lattice during all phases of their motion. However, such a geometry is possible during some phases.

Transfer switching and bubble nucleation in the illustrated system are easily provided by charged-wall assisted transfer switches and nucleators. Because numerous advantages result when magnetic charged walls are used, the currents required for switching and nucleation are significantly reduced from their normal levels. Furthermore, charged-wall assited nucleators and transfer switches are easily integrated into the storage system design and structure which provides a less complex bubble lattice system.

CELL SIZE AND BUBBLE MOVEMENT (FIGS. 2 & 3A–3I)

Figure 2:
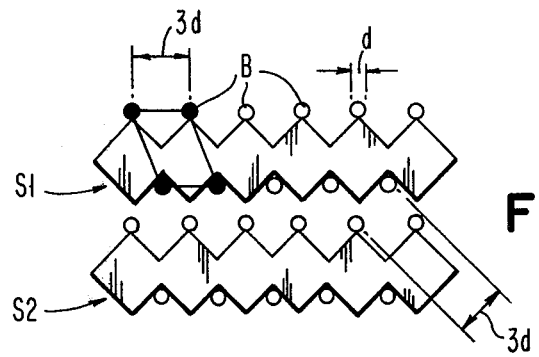
FIG. 2 is an illustration of a portion of the storage area of FIG. 1, and is used to illustrate the spacing and cell size in the storage area.
Figure 3A:
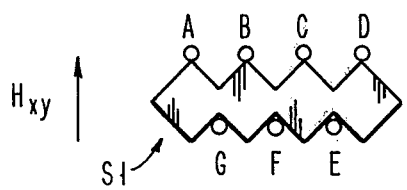
FIGS. 3A–3I illustrate the movement of magnetic bubble domains in a fully populated storage system in accordance with the principles of the present invention.
Figure 3F:
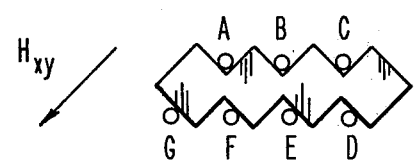
Figure 3B:
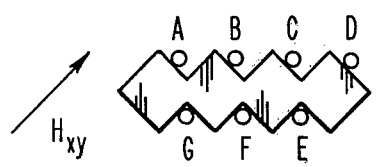
Figure 3G:
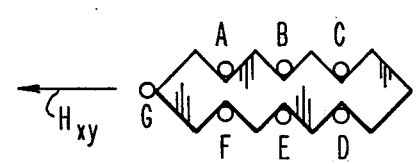
Figure 3C:
Figure 3H:
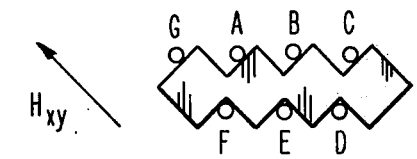
Figure 3D:
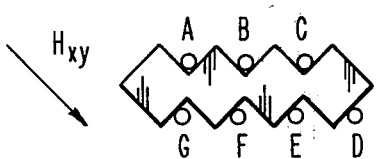
Figure 3I:
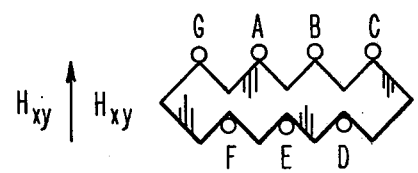
Figure 3E:
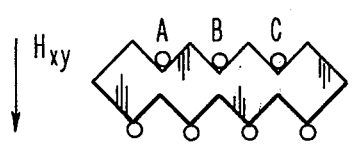

FIG. 2 shows a portion of the storage area S and is used to illustrate representative spacings between bubble domains and the size of the storage cell. Only two storage registers S1 and S2 are shown for ease of illustration.

Bubble domain B, indicated by the darkened circles which are joined together, are bubble domains in a single storage cell. The storage cell shown here is a parallelogram having bubble-bubble distances of approximately 3 bubble diameters ($3d$). This cell size is significantly reduced compared to the cell sizes normally found in contiguous element bubble propagation systems.

Although the spacing between adjacent bubble domains in the illustration of FIG. 2 is approximately 3 bubble diameters, this spacing can be varied and can be made to be that of other bubble lattice systems. A representative range of spacings is $1.5d$–$3d$. Depending upon the bubble-bubble spacing, the closeness of the registers S1 and S2 is adjusted as is the size of the individual propagation elements and their shapes. Those of skill in the art will be easily able to provide a proper design, using the principles relative to bubble lattice systems and the principles relative to contiguous disk bubble devices.

In an example, interacting bubble domains were moved in accordance with the principles of this invention by contiguous patterns. These patterns were the familiar "contiguous disk" patterns formed in a $(GdTmY)_3(GaFe)_5O_{12}$ magnetic garnet drive layer having a thickness $h_d = 0.468$ microns. The disks had a period of about 4.5 microns and the individual shift register patterns were separated by about 2.5 microns. The $(EuTmY)_3(GaFe)_5O_{12}$ garnet storage film had a thickness $h_b = 0.992$ micron, and magnetization $4\pi M_s = 586$ gauss.

For the two layer drive/bubble composite, $4\pi M_s = 575$ gauss, and the nominal bubble diameter was 1.225 microns. The stabilizing bias field $H_b$ was uniform across the bubble film, having a magnitude of about 270–300 Oe. The reorienting drive field was ~18 Oe.

Thus, the bubble storage cell was about 4.5 microns × 2.5 microns in this example.

FIGS. 3A-3I illustrate the movement of bubble domains along one of the shift registers S1, as field $H_{xy}$ reorients. In these FIGS., the drive field $H_{xy}$ is a rotating magnetic field which rotates in a clockwise direction. The FIGS. indicate the positions of the bubble domains A-G for different orientations of field $H_{xy}$.

As is apparent from these FIGS., domains A-G move in opposite directions on opposite sides of register S1. Domains on the top of register S1 move to the right while domains on the bottom of this register move to the left in response to the clockwise rotation of field $H_{xy}$. Comparing FIGS. 3A and 3I, it is apparent that the domains move 1 bit position during each rotation of field $H_{xy}$.

ALTERNATIVES

Although the invention has been shown in the context of a major/minor loop storage organization, it should be understood by those of skill in the art that any type of storage organization can be chosen. What is important is that tightly packed arrays of bubble domains are moved by contiguous propagation elements and that a complete storage system can be designed by using features similar to those in both conventional isolated bubble systems and bubble lattice systems.

The contiguous propagation elements can have any design (shape) and their degree of overlap with one another can be varied depending upon the density of the lattice domains. Further, different types of read-out devices can be provided such as that shown in U.S. Pat. No. 4,040,020. Still further, different bubble domain nucleators and accessing techniques can be used. For instance, bubble domains need not be accessed only at the ends of the registers S1-S3. It is possible to provide accessing of columns within the registers by using the techniques described for other bubble lattice systems.

Accordingly, those of skill in the art will be able to design numerous variations to the embodiments described in accordance with the principles of this invention.

What is claimed is:

1. A magnetic bubble domain device for moving magnetic bubble domains comprising:
   a magnetic medium in which said bubble domains in an array can be moved,
   a propagation pattern including contiguous propagation elements along which said bubble domains move as a magnetic field reorients in the plane of said pattern, said pattern including magnetic means for magnetically coupling to each of said bubble domains in said array, the resolution of said magnetic means being independent of the resolution of said propagation elements,
   said bubble domains in said array being sufficiently close to one another that magnetic interactions occur therebetween.

2. The device of claim 1, where said bubble domains are substantially arranged in rows and columns where adjacent rows of said bubble domains move in opposite directions.

3. The device of claim 1, where said bubble domains are in a close packed array forming a bubble domain lattice.

4. The device of claim 1, where said propagation pattern has a generally undulating edge along which said bubble domains move.

5. The device of claim 4, where said contiguous elements in said pattern have curved edges.

6. The device of claim 4, where said contiguous elements in said pattern have generally circular edges.

7. The device of claim 4, where said contiguous elements in said pattern have generally diamond shaped edges.

8. A magnetic bubble domain lattice device, comprising:
   a magnetic film in which said bubble domains can be moved,
   a lattice of interacting bubble domains in said film,
   a plurality of contiguous element propagation patterns for moving bubble domains in said lattice in response to the reorientation of a magnetic field in the plane of said pattern there being magnetic charged walls magnetically coupled to each of said bubble domains in said lattice during movement of said bubble domains.

9. The device of claim 8, including means for moving adjacent rows of bubble domains in opposite directions in response to the reorientation of said magnetic field.

10. The device of claim 8, where said lattice is comprised of rows and columns of bubble domains, said columns being arranged at angles of approximately 60° with respect to said rows.

11. The device of claim 8, where said bubble domains in said lattice are spaced from one another by distances less than 4 bubble diameters.

12. The device of claim 8, where said propagation patterns have generally undulating edges along which said bubble domains move.

13. The device of claim 12, where said pattern is comprised of ion implanted regions of a magnetic film.

14. The device of claim 8, where said contiguous element propagation patterns are portions of a magnetic layer having a component of magnetization substantially in the plane of said magnetic layer.

15. The device of claim 8, where said lattice is substantially hexagonal.

16. A magnetic bubble domain storage system, comprising:
   a magnetic medium in which said bubble domains can be moved,
   a storage area comprising a plurality of contiguous element bubble propagation patterns for moving bubble domains in said storage area, said propagation patterns including means for producing magnetic charged walls for coupling flux to each of said bubble domains, said bubble domains being arranged in a packed array where the bubble domains are sufficiently close to one another to have magnetic interactions therebetween,
   means for placing bubble domains into said storage area, and
   means for removing bubble domains from said storage area.

17. The storage device of claim 16, where said bubble domains in said storage area are coded to represent information, said storage device further including means for detecting said buble domains to read said information.

18. The storage device of claim 16, where said array of bubble domains forms a bubble domain lattice.

19. The storage device of claim 16, where said contiguous element propagation patterns form a plurality of registers in said storage area, said bubble domains being moved along said registers in response to the reorientation of a magnetic field substantially in the plane of said propagation patterns, including means for moving adjacent rows of said bubble domains in said storage area in opposite directions.

20. The storage device of claim 16, where said bubble domains in said storage area have spacings therebetween less than 4 bubble diameters.

21. The storage device of claim 16, where bubble domains outside of said storage area are substantially isolated from one another.

22. The storage device of claim 16, where said array of bubble domains is substantially a lattice of rows and columns of bubble domains in a hexagonal lattice, said bubble domains in said storage area being coded to represent information.

23. A magnetic bubble domain system, comprising:
a magnetic medium in which said bubble domains can be moved,
contiguous element propagation patterns for moving bubble domains in an array of interacting domains including means for moving adjacent rows of bubble domains in said array in opposite directions and means for providing direct forces on substantially all of said bubble domains in said array, said bubble domains moving along said contiguous element propagation patterns in response to the reorientation of a magnetic field substantially in the plane of said pattern.

24. The device of claim 23, where said bubble domains in said array are arranged in a lattice during at least one phase of their movement by said propagation patterns.

25. A magnetic bubble domain device, comprising:
a magnetic layer having in-plane magnetization patterned to provide contiguous propagation elements along which bubble domains in a bubble domain film move in response to the reorientation of a magnetic field in the plane of said magnetic layer, said bubble domains being sufficiently close to one another that interactions occur therebetween,
said propagation pattern including means for producing magnetic charged walls coupled to each of said bubble domains in said array of interacting bubble domains, and
means for moving said charged walls along said propagation pattern to move bubble domains coupled to said moving charged walls.

26. The device of claim 25, where said charged walls are located closer to one another than the width of said propagation elements.

27. A method for moving bubble domains in an array of interacting bubble domains, comprising the steps of:
producing a plurality of magnetic charged walls in a magnetic layer which are coupled to said bubble domains, the number of magnetic charged walls corresponding substantially to the number of magnetic bubble domains in said array of interacting domains, and
moving said magnetic charged walls to move magnetic bubble domains which are coupled to said charged walls.

28. The method of claim 27, wherein said magnetic charged walls are moved by applying a reorienting magnetic field substantially in the plane of said magnetic layer.

* * * * *